(12) United States Patent
Chen et al.

(10) Patent No.: US 6,759,302 B1
(45) Date of Patent: Jul. 6, 2004

(54) METHOD OF GENERATING MULTIPLE OXIDES BY PLASMA NITRIDATION ON OXIDE

(75) Inventors: Chia-Lin Chen, Hsinchu (TW); Chien-Hao Chen, Ilan (TW); Mo-Chiun Yu, Chung-Ho (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/209,433

(22) Filed: Jul. 30, 2002

(51) Int. Cl.[7] ............................................. H01L 31/119
(52) U.S. Cl. ................... 438/275; 438/283; 438/294; 438/765; 438/424; 438/301; 257/410
(58) Field of Search ........................... 438/275, 283, 438/294, 765, 424, 301, 766, 770; 257/410

(56) References Cited

U.S. PATENT DOCUMENTS

| | | | |
|---|---|---|---|
| 6,080,682 A | 6/2000 | Ibok | 438/770 |
| 6,171,911 B1 | 1/2001 | Yu | 438/275 |
| 6,197,647 B1 | 3/2001 | Gardner et al. | 438/301 |
| 6,232,244 B1 | 5/2001 | Ibok | 438/770 |
| 6,258,673 B1 * | 7/2001 | Houlihan et al. | 438/275 |
| 6,261,972 B1 | 7/2001 | Tews et al. | 438/766 |
| 6,380,102 B1 * | 4/2002 | Oh | 438/771 |
| 6,458,663 B1 * | 10/2002 | Moore et al. | 438/287 |
| 6,475,862 B1 * | 11/2002 | Ando | 438/264 |
| 6,528,434 B2 * | 3/2003 | Chen | 438/787 |
| 6,602,751 B2 * | 8/2003 | Oohashi | 438/275 |

* cited by examiner

*Primary Examiner*—Alexander Williams
*Assistant Examiner*—Remmon R. Fordé
(74) *Attorney, Agent, or Firm*—George O. Saile; Stephen B. Ackerman

(57) ABSTRACT

A method of forming multiple gate oxide thicknesses on active areas that are separated by STI isolation regions on a substrate. A first layer of oxide is grown to a thickness of about 50 Angstroms and selected regions are then removed. A second layer of oxide is grown that is thinner than first growth oxide. For three different gate oxide thicknesses, selected second oxide growth regions are nitridated with a $N_2$ plasma which increases the dielectric constant of a gate oxide and reduces the effective oxide thickness. To achieve four different gate oxide thicknesses, nitridation is performed on selected first growth oxides and on selected second growth oxide regions. Nitridation of gate oxides also prevents impurity dopants from migrating across the gate oxide layer and reduces leakage of standby current. The method also reduces corner loss of STI regions caused by HF etchant.

10 Claims, 8 Drawing Sheets

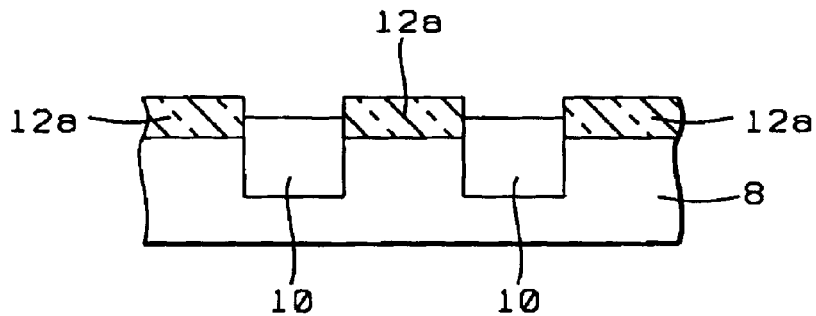
FIG. 1a – Prior Art
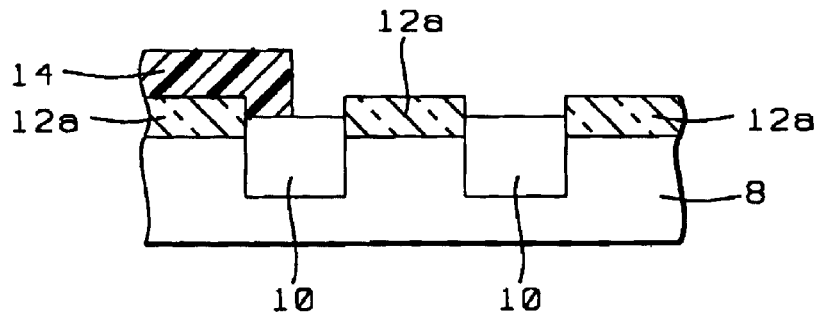
FIG. 1b – Prior Art
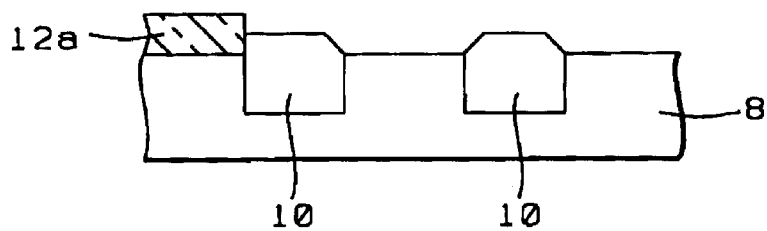
FIG. 1c – Prior Art
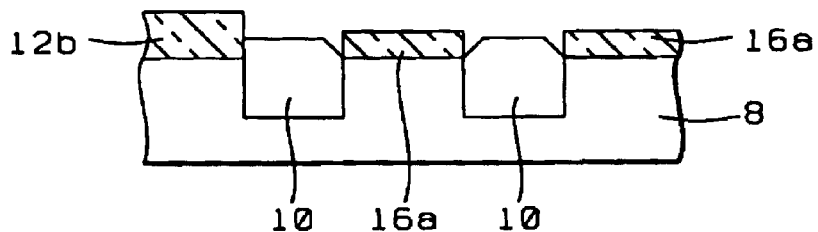
FIG. 1d – Prior Art

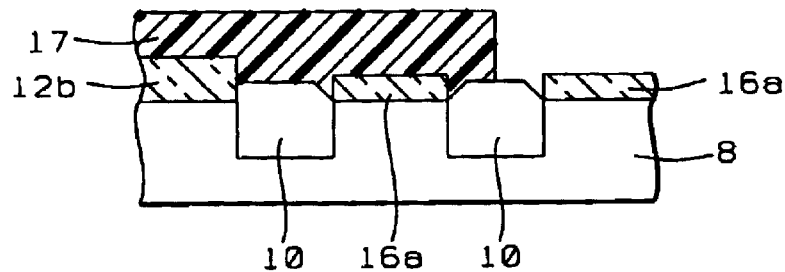
FIG. 1e – Prior Art
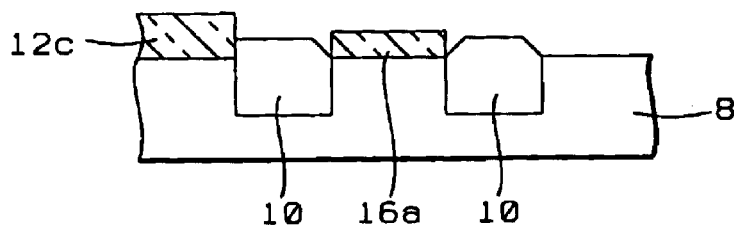
FIG. 1f – Prior Art
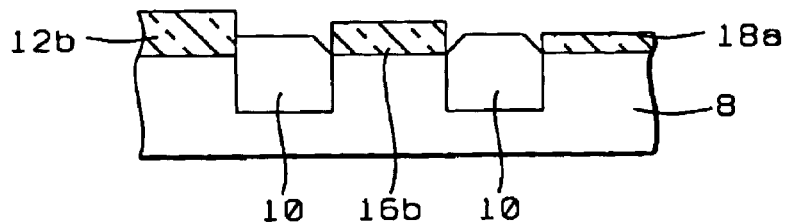
FIG. 1g – Prior Art
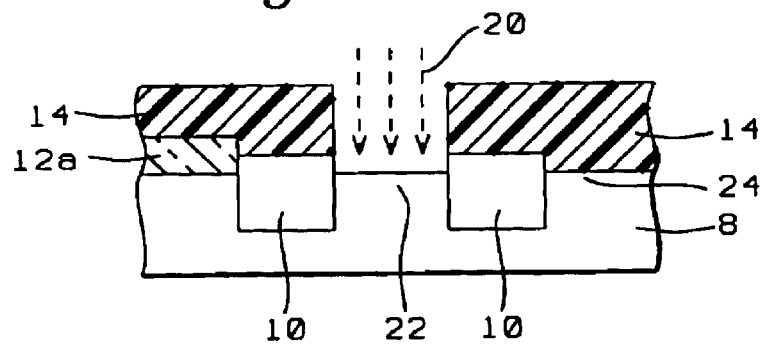
FIG. 2a – Prior Art

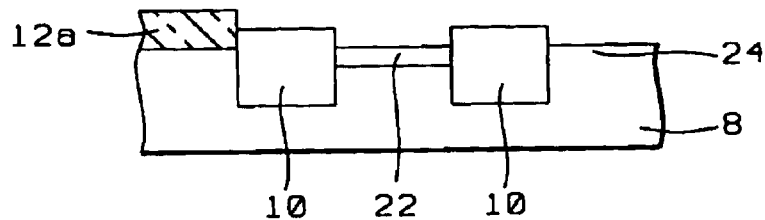
FIG. 2b – Prior Art
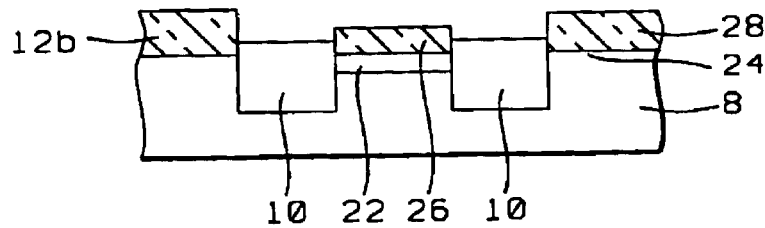
FIG. 2c – Prior Art
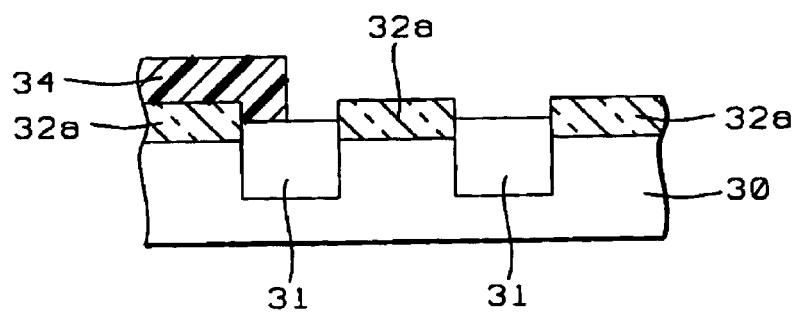
FIG. 3a
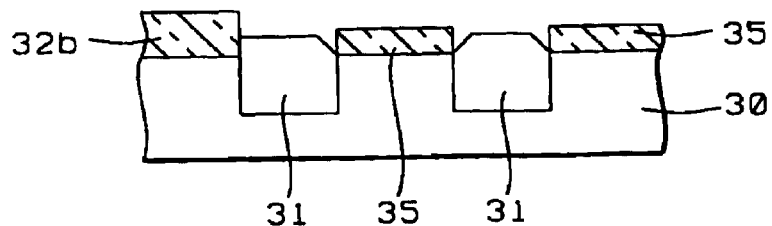
FIG. 3b

METHOD OF GENERATING MULTIPLE OXIDES BY PLASMA NITRIDATION ON OXIDE

FIELD OF THE INVENTION

The present invention relates to methods for the manufacture of semiconductor devices. In particular, the methods involve forming multiple gate oxide thicknesses during the fabrication of integrated circuits for system on a chip (SOC) technology and for embedded DRAM technology.

BACKGROUND OF THE INVENTION

Complimentary metal oxide semiconductor (CMOS) field effect transistor (FET) technology involves the formation of n-channel FETs (NMOS) and p-channel FETs (PMOS) to form low current and high performance integrated circuits. These devices contain a substrate having various electrically isolated active areas that are separated by regions of insulating material such as shallow trench isolation (STI) features or field oxide isolation (FOX). A gate oxide which is normally silicon dioxide is grown on the substrate in active areas and then a polysilicon gate electrode is formed on the gate oxide. Ion implantation is then typically used to form source/drain regions in the substrate adjacent to the channel which is below the electrode and gate oxide. For example, boron can be implanted to form p-channels and arsenic can be implanted to form n-channels. The final steps in the process of forming the device consist of depositing an insulating layer on the substrate and forming contacts to the source/drain regions and to the gate electrodes.

The thickness of the gate oxide is critical to the performance of the device. There is a constant need for thinner oxides to allow a higher speed device with lower power consumption. Current technology requires gate oxide thicknesses of about 50 Angstroms or less, One concern associated with a thin gate oxide is that it will not be thick enough to prevent migration of impurities such as boron dopant from occurring between the gate electrode and channel regions which will degrade the device performance. U.S. Pat. No. 6,197,647 describes a method of depositing a thin gate oxide thickness of 5 to 15 Angstroms followed by deposition of a polysilicon layer that contains nitrogen to inhibit the migration of impurities across the gate oxide layer.

For ultra thin silicon dioxide gates, leakage current will increase tremendously as thickness is reduced. This will cause a large current in the standby mode ($I_{OFF}$) and a large standby power consumption, thereby making products with these devices commercially unacceptable.

Another concern associated with thin gate oxides is that an excessively high voltage applied to the gate electrode can cause a gate breakdown resulting in a short circuit between the gate electrode and source region. A thicker gate oxide will allow a higher breakdown voltage but at the expense of a slower speed for the circuit. To partially alleviate the thickness requirement, a dual gate oxide technology has been developed that consists of thicker oxides in circuits such as I/O applications where higher speed is not needed. A higher voltage of about 5 V can be applied and the thicker oxide will provide good reliability. A second gate oxide thickness that is thinner than the first is used to form integrated circuits that require high speed. These circuits typically operate at a lower voltage of about 2 V.

U.S. Pat. No. 6,261,972 mentions that dual oxide thicknesses can be formed by means of a nitridation of the substrate in active areas where growth of a thinner oxide thickness is desired. The two different oxide thicknesses are grown simultaneously in the same chamber because growth on the nitrogen implant d active area is retarded compared to growth on an active ar a without a nitrogen implant. A drawback to this approach is that after nitrogen is introduced into the active channel region in the silicon substrate, significant mobility degradation occurs. U.S. Pat. Nos. 6,080,682 and 6,232,244 also involve nitridation of a substrate and deposition of a blocking layer to prevent loss of nitrogen during a subsequent annealing process in formation of dual gate oxide thicknesses. Nitridation also has a negative impact on the quality of the silicon interface with silicon dioxide.

In U.S. Pat. No. 6,171,911, a method of forming a dual gate oxide is described. Gate oxides are formed in separate steps and a second thinner oxide thickness is grown after removing a previous thicker growth in regions where a thinner thickness is desired. Another feature of this patent is that the annealing step is performed in a hydrogen atmosphere to reduce the native oxide thickness and improve its quality. A native oxide of 10 Angstroms or less generally forms on a substrate if the surface is exposed to air. Contaminants are removed in the annealing process and the layer is densified from about 10 Angstroms to about 4 Angstroms with improved uniformity.

Oxides are generally grown in a thermal oxidation furnace using a dry oxygen ambient at a temperature of between 600° C. and 800° C. Other methods of forming thin thermal oxides are by RTO (rapid thermal oxidation) or by ISSG (in-situ steam generation).

With the introduction of system on a chip (SOC) technology, there is a need to form multiple gate oxide thicknesses on a substrate to enable the fabrication of multiple circuits with diff rent functions that can all perform at once. For example, circuits for I/O connections with a relatively thick gate oxide of about 50 Angstroms, circuits for high speed devices with a relatively thin gate oxide thickness of about 20 Angstroms and circuits for low power devices with intermediate gate oxide thicknesses are required to operate simultaneously on a substrate. In some cases, more than three different oxide thicknesses may be necessary. Methods of generating more than two oxide thicknesses usually require etch back of unwanted oxide regions resulting in undesirable STI corner loss. Moreover, a large gate leakage is observed on the thinnest oxides. Therefore, an improved method of making multiple gate oxide thicknesses is needed. The improved method should minimize STI corner loss caused by etching, lower the leakage current for thin oxide layers, and prevent boron mobility between the gate electrode and underlying channel. An improved process will also avoid nitridation of a silicon substrate that leads to a poor silicon/silicon oxide interface and reduced ion mobility.

A recent technology called embedded DRAM or e-DRAM involves a combination of memory and logic functions on a chip. Memory circuits require an effective gate oxide thickness of about 50 Angstroms while low power circuits require an effective gate oxide thickness of 12 to 15 Angstroms and high performance circuits need an effective gate oxide thickness in the range of 8 to 12 Angstroms. Traditional ultra-thin silicon dioxide gates are unacceptable because of a high leakage current and a high mobility of doped impurities such as boron between the gate electrode and channel regions. Therefore, an improved method of making e-DRAM devices is needed so that higher performance can be combined with high reliability to satisfy the demand of new technologies.

SUMMARY OF THE INVENTION

An objective of the present invention is to provide a method of forming multiple gate oxide thicknesses during the fabrication of a semiconductor device, microelectromechanical (MEMS) device, or other device requiring the formation of patterned features on a substrate. Preferably the method will provide a lower effective gate oxide thickness so that a thickness sufficient to prevent gate breakdown can be maintained while improving the performance or speed of the device.

A further objective of the present invention is to provide a method of forming multiple gate oxide thicknesses that prevent mobile impurities, especially boron, from migrating between the gate electrode and channel regions of the transistor.

A still further objective of the present invention is to provide a method of forming multiple gate oxide thicknesses that has little or no effect on the integrity of the STI regions in the device, especially minimizing corner rounding that occurs with etch back methods.

A still further objective is to reduce the leakage current across the thin gate oxide layers in the resulting MOSFET to avoid degradation in device performance.

These objectives are achieved by first providing a substrate with active areas separated by regions of insulating material such as STI features. In the first embodiment where a triple oxide thickness is generated, a first layer of silicon dioxide is grown on the active areas. Some regions of the oxide layer are selectively removed by patterning a photoresist layer on the substrate and then etching away the oxide that has been exposed through openings in the photoresist layer. The photoresist is stripped and a second oxide layer is grown on the active areas. The second oxide layer is thinner than the first oxide layer and the second growth adds to the oxide thickness in first growth areas that have not been removed by etching. In first growth regions where the oxide was previously removed by etching, the second growth forms a thinner oxide thickness than was removed by the previous etch. A photoresist is then patterned on the substrate to selectively expose some of the second growth regions. A plasma nitridation is performed which introduces nitrogen into the second growth oxide regions that are uncovered in the photoresist pattern. The nitridation reduces the effective oxide thickness of the second growth gate oxide relative to second growth regions that are not subjected to nitridation. The photoresist is stripped and the substrate is ready for further processing. An annealing step can be performed to remove moisture and contaminants from the substrate and to density the gate oxides into more uniform layers. As a result, there are three effective oxide thicknesses formed. The thinnest oxide layer contains nitrogen which prevents mobile impurities such as boron from migrating between the underlying channel and the gate electrode once the device fabrication is complete. Another advantage is that the number of etch steps has been reduced from two in prior art to one. This reduces the corner rounding damage to the STI features.

In a second embodiment, multiple oxide layers involving four different oxide thicknesses are generated. The first embodiment is followed to the point where a photoresist is selectively patterned over the first and second oxide growth regions. In this case, some of both first and second growth regions are uncovered by the photoresist pattern. Nitridation of the uncovered first and second oxide growth regions reduces the effective oxide thickness in these areas relative to the first and second oxide growth regions that are protected by photoresist. The photoresist layer is then removed, and the substrate is cleaned and annealed. The substrate is ready for subsequent processing in which the gate electrode and source/drain regions are formed. As a result, there are four different effective gate oxide thicknesses on the substrate which can be used to form different types of circuits. Nitridation of two of the four gate oxides helps to prevent boron migration through the gate oxide and reduces leakage of standby current through the gate oxide in the final device. The number of etch steps has been reduced from two in prior art to one which minimizes damage to STI features.

In a third embodiment, multiple oxide layers involving four different oxide thicknesses are generated. The previous embodiment is followed to the point where the etch step after the first oxide growth is shortened so that about 20 Angstroms of first growth oxide remains in regions that are uncovered in the photoresist pattern. This reduces the etching effect on the STI features such that little or no corner rounding occurs. After the photoresist is stripped, another photoresist pattern is formed to selectively expose some of first oxide growth regions that were not reduced in thickness by etch and some first oxide growth regions that were thinned to 20 Angstroms by the etch. Nitridation of the uncovered oxide regions reduces the effective oxide thickness in these areas. The second photoresist layer is then stripped and the substrate is cleaned and annealed. As a result, four different effective oxide thicknesses have been generated on the same substrate that can be used to form four different types of circuits, including I/O, low power, and high performance circuits on the same chip for SOC technology applications. Two of the gate oxides have nitrogen implants that prevent boron migration between the gate electrode and channel regions and reduce leakage of standby current through the gate.

In a fourth embodiment, triple gate oxide layers involving three different oxide thicknesses are generated. A thin RTO oxide is grown on all active regions including one DRAM and two logic regions of the substrate and then $HfO_2$ is deposited. This is a higher k dielectric material than silicon dioxide and reduces the effective oxide thickness and thereby improves performance for a given physical thickness of oxide layer. The oxide is selectively removed from logic regions and a RTO oxide is grown on the active regions. The growth on the high performance active region is retarded because of a previous nitrogen implant. Plasma nitridation is then performed on all gate oxide layers followed by an annealing process. As a result, the hafnium oxide/silicate formed on the DRAM region lowers the effective oxide thickness compared to silicon dioxide which essentially means that the same physical oxide thickness can be maintained to prevent gate breakdown while providing a higher circuit speed that is normally realized only with a thinner thickness. The higher k dielectric material in the gate oxide provides a lower effective oxide thickness. Since all gate oxide regions have nitrogen implants, resistance to boron migration between gate electrode and channel regions has been improved and leakage of standby current is reduced. The method involves only one etch to minimize the effect on STI corners. In this manner, a device for e-DRAM applications can be fabricated which contains DRAM circuits in addition to low power and high performance logic circuits.

BRIEF DESCRIPTION OF THE DRAWINGS

The drawings are intended to provide a more thorough understanding of the invention. The drawings illustrate embodiments of the invention and together with the description serve to explain the principles of the present invention.

FIGS. 1a–1g are cross sectional views of a substrate which illustrate a related art method of forming a triple oxide gate thickness in a semiconductor device.

FIGS. 2a–2c are cross sectional views of a substrate that show a process of forming three different gate oxide thicknesses in a semiconductor device according to prior art.

FIGS. 3a–3d are cross sectional views of a substrate which show a method of forming three different gate oxide thicknesses in a semiconductor device according to the first embodiment of the present invention.

DETAILED DESCRIPTION OF THE INVENTION

Figure 3C:
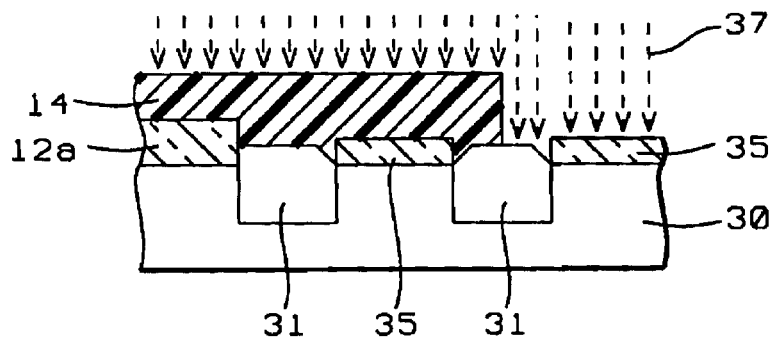

The present invention provides a method for forming multiple gate oxide layers on active regions of transistors during the fabrication of semiconductor devices, MEMS devices, or other devices that require the formation of fine patterns on a substrate.

Referring to FIG. 1a, a related art method known to the inventors for forming triple gate oxide thicknesses involves first providing a substrate 8 where STI features 10 comprising trenches filled with dielectric material are used to separate active areas whereupon a first oxide growth layer 12a has been formed. The first oxide growth layer 12a is usually silicon dioxide with a thickness of about 50 Angstroms.

In FIG. 1b, a photoresist pattern 14 is formed on the substrate. Portions of first oxide growth layer 12a that are not protected by photoresist 14 are etched away as shown in FIG. 1c using a dilute HF etchant consisting of one part by volume of 49% HF and 99 parts by volume of Dl water. The substrate is rinsed with Dl water and dried and then the photoresist is stripped with a conventional method. The etchant attacks the corners at the top of the STI features and causes some rounding. This degrades the performance of the resulting device by causing an excessive electric field.

A second growth oxide layer 16a about 20 Angstroms thick as shown in FIG. 1d is then formed on the active areas where first growth oxide layer 12a was previously removed. The second oxide growth adds to the thickness of the remaining first growth layer 12a to form a thicker oxide layer 12b of about 55 to 60 Angstroms thick.

A photoresist pattern 17 in FIG. 1e is formed to selectively expose second growth layers 16a that will be removed to provide for third growth layers. An etch process similar to the one described for removing the first growth layer 12a is used to remove second growth layers 16a not protected by photoresist 17. The photoresist 17 is then stripped by conventional means to leave the structure shown if FIG. 1f which has one active area of substrate 8 covered by oxide layer 12b, a second active area covered by oxide layer 16a, and a third active area with no oxide growth. Corner rounding is evident in several places on STI features 10.

A third growth oxide layer 18a of about 17 Angstroms is formed in FIG. 1g. The third oxide growth adds slightly to the thickness of second growth oxide layer 16a to form layer 16b and adds slightly to the thickness of oxide layer 12b to form layer 12c on substrate 8. However, the thickness of layer 18a is usually not sufficient to prevent considerable leakage of standby current through layer 18a in the final device. The thickness of layer 18a is also too thin to prevent doped boron impurities from migrating through layer 18a in the final device.

Referring to FIGS. 2a–2c, a prior art method of forming triple gate oxide thicknesses in a semiconductor device involves introducing nitrogen into selected active areas by a nitrogen plasma or a nitrogen implant. A substrate 8 equivalent to the on represented in FIG. 1c is patterned with a photoresist 21 to selectively expose substrate 8 between two STI features 10. First growth oxide layer 12a and region 24 near the top of substrate 8 are protected from nitride plasma 20 by photoresist 21. When a nitrogen implant is used, nitrogen is implanted in exposed regions to reach a concentration of about $10^{17}$ atoms/cm$^3$ to about $10^{20}$ atoms/cm$^3$.

Photoresist 21 is stripped to leave first growth oxide layer 12a and nitrogen implant region 22 on substrate 8 as shown in FIG. 2b. An isothermal annealing step is usually done at this point to repair damage to the substrate in the nitridated areas. Oxide growth is retarded on region 22 compared to region 24 because of the nitrogen implant.

Referring to FIG. 2c, a second oxide growth results in a thin oxide layer 26 above the nitrogen implant region 22 and a thicker oxide layer 28 above region 24 on substrate 8. Second oxide growth also adds to the thickness of layer 12a in FIG. 2b and it becomes layer 12b which is thicker than layers 26, 28 in FIG. 2c. Although three different oxide thicknesses are formed, the nitrogen implant in region 22 significantly reduces electron mobility in that region in the final device and performance is degraded.

In one embodiment, the present invention is a method of forming three gate oxide layers with three different oxide thicknesses on a substrate. A substrate is provided in which STI features 31 have been formed in a substrate 30 as shown in FIG. 3a. A first silicon dioxide layer 32a which is also referred to as first growth oxide layer 32a is grown to a thickness of about 50 Angstroms on all three active areas by placing substrate 30 in an oxidation furnace with a dry oxygen ambient at a temperature of between 600° C. and 800° C. for a period of about 20 minutes. A patterned photoresist layer 34 is formed on the first growth oxide layer 32a and on STI features 31 to selectively expose portions of first growth oxide layer 32a that will be removed and replaced with a thinner oxide layer.

Referring to FIG. 3b, the exposed first growth oxide layer 32a is removed by dipping in an HF solution consisting of 1 part by volume of 49% HF and 99 parts by volume of Dl water for a period of about 60 to 120 seconds. Corners of the STI features 31 that are exposed to the etchant become rounded. After substrate 30 is rinsed with Dl water and dried, the patterned photoresist layer 34 is stripped with a commercially available wet stripper. The substrate is then typically cleaned by immersing sequentially in NH$_4$OH/H$_2$O$_2$ (SC-1) and HCl/H$_2$O$_2$(SC-2) cleaning solutions that are part of the standard RCA cleaning process followed by Dl water rinsing and drying. Further treatment with dilute HF is omitted to avoid attack on the first growth oxide layer 32a.

Substrate 30 is subjected to a thermal annealing step in a chamber containing $N_2$ flowing at a rate of between 5 and 10 standard liters per minute (slm) and He flowing at a rate of between about 5 and 10 slm at a temperature of between about 900° C. and 1200° C. and a chamber pressure of between about 10 and 100 Torr for a period of 30 to 120 seconds. This step removes moisture and contaminants and densities any native oxide growth on regions that have been etched back to substrate.

A second oxide layer 35 is then preferably grown in an oxidation furnace at a temperature of from 600° C. to about 800° C. for a period of 60 to 120 seconds to provide a second oxide thickness of about 22 Angstroms. The second growth increases the oxide thickness on the first growth oxide layer 32a slightly to form a first oxide layer 32b with a first oxide thickness which is about 55 to 60 Angstroms thick.

A new feature of the present invention involves nitridation of selected oxide layers. Referring to FIG. 3c, a photoresist layer 36 is patterned on the first oxide layer 32b, second oxide layer 35 and STI features 31 to selectively expose portions of the second oxide layer 35 that are intended to have a different effective oxide thickness (EOT). The photoresist layer 36 is thick enough to prevent nitridation of underlying first oxide layer 32b, and second oxide layer 35. A plasma nitridation 37 is then performed in a plasma chamber with a nitrogen flow rate of 100 sccm, a power of 300 Watts and a pressure of 1.5 Torr for a period of 30 to 300 seconds and preferably at a temperature of less than 100° C.

Figure 3D:
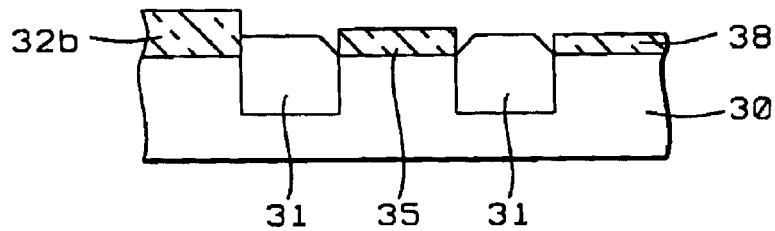

The nitridation of exposed second oxide layer 35 in FIG. 3c introduces nitrogen into the second oxide layer to give a nitridated oxide layer or third oxide layer 38 in FIG. 3d that has a higher dielectric constant k than the protected second oxide layer 35 which provides a lower effective oxide thickness (EOT) or third oxide thickness for the third oxide layer 38 of 17 Angstroms. The thickness of the second oxide layer 35 that was protected by photoresist remains at 22 Angstroms and the oxide thickness of the first oxide layer 32b remains at about 55 to 60 Angstroms. Therefore, three different oxide thicknesses have been formed on the three oxide layers 32b, 35, 38 between STI regions 31 on substrate 30.

Referring to FIG. 3d, photoresist layer 36 is removed with a liquid stripper and substrate 30 is cleaned as previously described with SC-1 and SC-2 cleaning solutions followed by rinsing with Dl water and drying. An annealing step similar to the one described previously is used to densify the oxide layers and repair damage to the third oxide layer 38.

Nitrogen content in the third oxide layer 38 prevents boron migration between the gate electrode and channel regions in the final device and reduces leakage of standby current in the final device. The amount of etch back steps has been reduced from two in the previously described prior art method to one in the present invention which reduces STI loss at all exposed corners and especially minimizes corner loss to the STI feature 31 adjacent to the third oxide layer 38. An excellent $Si/SiO_2$ interface has been preserved at all gate oxides which leads to good electron mobility in the final device.

In a second embodiment, the present invention is a method of forming four different gate oxide thicknesses on a substrate which is useful in fabricating semiconductor devices that have several functions or systems on a chip (SOC) wherein different types of circuits requiring different gate oxide thicknesses are needed. This embodiment is represented in FIGS. 4a–4d. First, a substrate 40 is provided which contains STI regions 41 that separate active areas where circuits will be formed. A first growth oxide layer 42a is grown to a thickness of about 50 Angstroms preferably in an oxidation furnace with a dry oxygen ambient at a temperature of 600° C. to 800° C. for a period of 20 minutes as in the previous embodiment. A photoresist layer 43 is then patterned to selectively expose portions of oxide layer 42a that will be removed and replaced with an oxide layer having a lower EOT than oxide 42a.

Figure 4A:
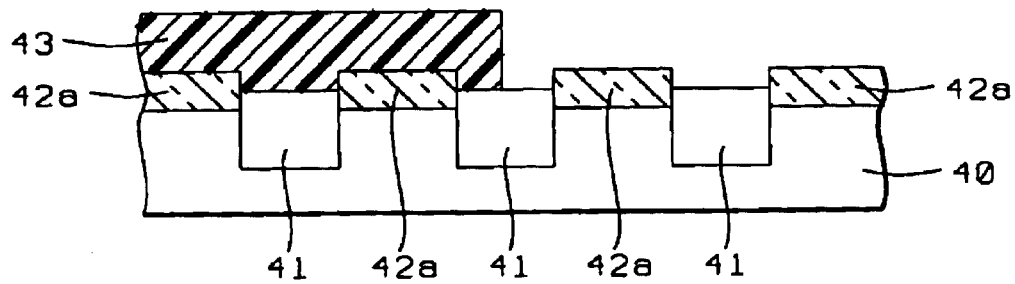
FIGS. 4a–4d are cross sectional views of a substrate that illustrate a process of forming four different gate oxide thicknesses in a semiconductor device according to an embodiment of the present invention.
Figure 4B:
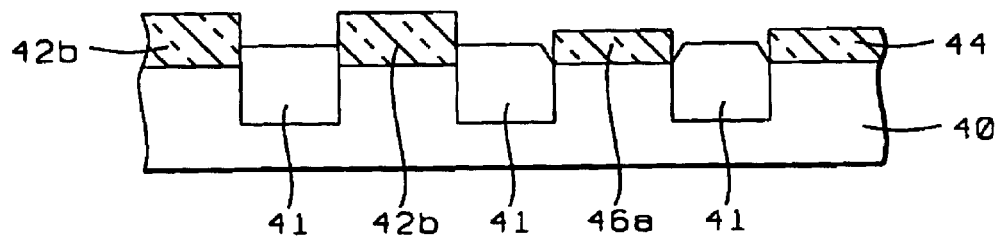

Referring to FIG. 4b, the exposed oxide regions 42a are etched away in dilute HF as described previously. Corners of STI regions 41 exposed to the etchant can become rounded during the treatment. Photoresist 43 is removed with a liquid stripper and substrate 40 is cleaned with SC-1 and SC-2 solutions as mentioned in the first embodiment. An annealing step may be performed here to remove moisture and contaminants and to densify any native oxide growth that can occur on substrate 40 after the strip process. A second oxide layer 44 about 20 Angstroms thick is then grown on substrate 40 in regions where oxide layer 42a was previously removed. In regions where oxide 42a remains in FIG. 4a, the second oxide growth adds slightly to the thickness to give oxide layer 42b about 55 to 60 Angstroms thick.

Figure 4C:
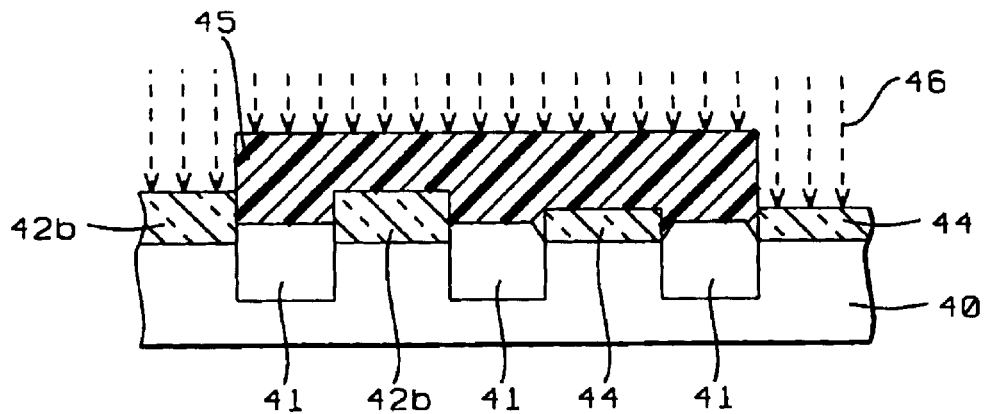
Figure 4D:
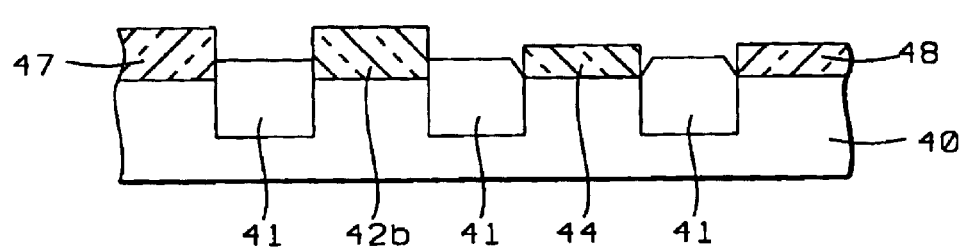

Referring to FIG. 4c, a photoresist layer 45 is patterned to expose selected oxide layers 42b, 44 while covering other oxide layers 42b, 44. A nitridation 46 with nitrogen plasma as described in the first embodiment is performed for a period of 30 to 300 seconds at less than 100° C. Oxide layer 42b that is not protected by photoresist 45 is nitridated. Introduction of nitrogen into oxide layer 42b results in nitridated oxide layer 47 in FIG. 4d and increases the dielectric constant of layer 47 relative to oxide layer 42b which decreases the EOT of layer 47 to 40 Angstroms. Oxide layer 44 that is not protected by photoresist 45 is also nitridated. Introduction of nitrogen into oxide layer 44 results in layer 48 in FIG. 4d and increases the dielectric constant of layer 48 relative to oxide 44 which decreases the EOT of layer 48 to about 15 Angstroms. The effective oxide thickness of layer 42b that was protected from nitridation remains in the range of 55 to 60 Angstroms. The effective oxide thickness of layer 44 that was protected from nitridation remains at 20 Angstroms.

Photoresist 45 is then removed using a liquid stripper and substrate 40 is cleaned with SC-1 and SC-2 solutions as described in the first embodiment. The substrate is rinsed with Dl water and dried. An annealing step similar to the one described in the first embodiment is preferably performed here to remove any moisture and contaminants left behind from the stripping and cleaning steps, to densify any native oxide formed after the stripping process, and to r pair any damage to the nitridated oxide layers 47 and 48. Substrate 40 is now ready for further processing which includes formation of gate electrodes, forming source/drain elements between STI regions 41, and forming contacts to the gate electrodes and to source/drain regions. The details for the subsequent processes required to fabricate a MOSFET are known to those skilled in the art and are not described here.

Thus, four different effective oxide thicknesses have been formed on substrate 40. Two layers 47, 48 have a nitrogen content which prevents impurity dopants such as boron from migrating between the gate electrode and channel regions in the final device. In addition, the nitridated layers 47 and 48 have a lower leakage of standby current ($I_{OFF}$) than non-nitridated oxide layers 42b and 44. The number of etch back steps has been reduced from two in prior art to one which minimizes the effect on corner rounding of STI features 41. Nitridation of substrate 40 has been avoided which provides good electron mobility in channel regions in the final device.

In a third embodiment, the etch back step described for FIGS. 4a–4b is shortened to 10 seconds and a regrowth of oxide is omitted. Exposed oxide layer 42a in FIG. 4a is selectively etched by dilute HF as before but the etch time is shortened to 10 seconds so that exposed oxide layer 42a is thinned to about 20 Angstroms thick to form oxide layer 50 in FIG. 5a. As a result there is little or no corner rounding of STI features 41 adjacent to oxide layer 50 during the etch process. Oxide layer 42a remains 50 Angstroms thick.

Photoresist 43 is removed and substrate 40 is cleaned by conventional methods. Referring to FIG. 5b, a photoresist 51 is patterned to selectively expose oxide layers 42a, 50 and to cover other selected layers 42a, 50. A nitridation 52 is then performed as described in the first embodiment. Oxide layers 42a, 50 that are not protected by photoresist 51 are nitridated to form layers 53, 54, respectively.

Figure 5A:
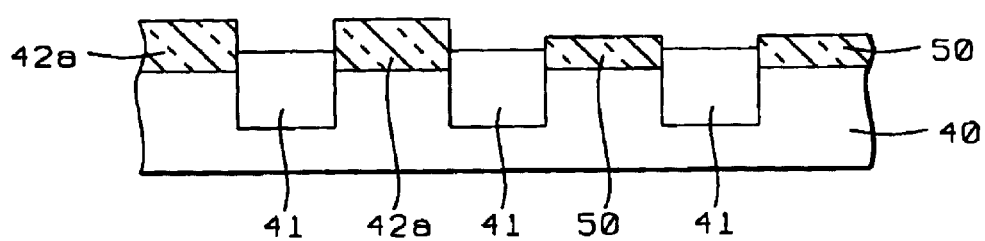
FIGS. 5a–5c are cross sectional views that show another method of forming four different gate oxide thicknesses according to an embodiment of the present invention.
Figure 5B:
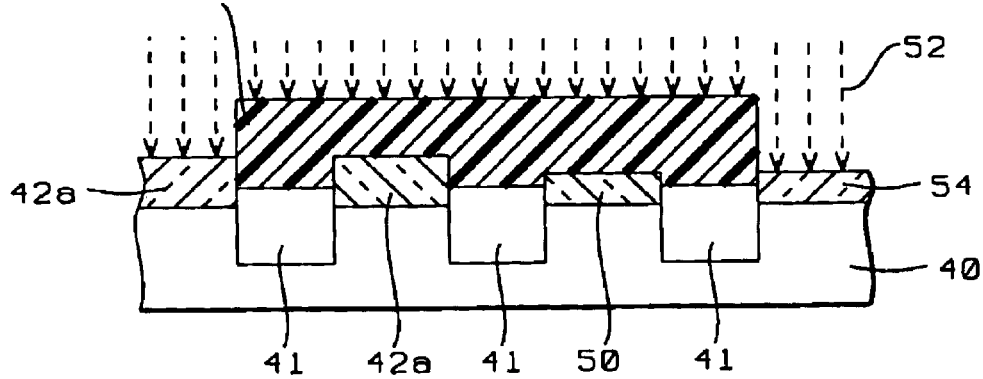
Figure 5C:
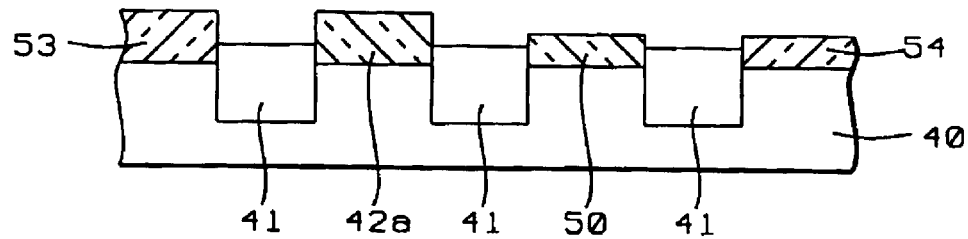

Referring to FIG. 5c, nitridated oxide layer 53 is formed with an EOT of about 35 to 40 Angstroms. The nitrogen content in layer 53 increases the dielectric constant relative to layer 42a and thereby lowers the EOT relative to oxide layer 42a. The thickness of adjacent oxide layer 42a remains at about 50 Angstroms. Nitridated oxide layer 54 is formed with an EOT of about 15 Angstroms while oxide layer 50 that was protected from nitridation still has a 20 Angstrom oxide thickness. The nitrogen content in layer 54 increases the dielectric constant relative to layer 50 and thereby lowers the EOT relative to oxide layer 50. Photoresist 51 is then removed and substrate 40 is cleaned by conventional methods. An annealing step is performed here to remove any moisture and contaminants left behind from the stripping and cleaning steps, to densify any native oxide formed after the stripping process, and to repair any damage to the nitridated oxide layers 53 and 54. Substrate 40 is now ready for further processing which includes forming gate electrodes, forming source/drain elements between STI regions 41, and forming contacts to gate electrodes and to source/drain regions.

Thus, four different effective oxide thicknesses have been formed on substrate 40. Two of the four oxide layers have a nitrogen content which prevents impurity dopants such as boron from migrating between the gate electrode and channel regions in the final device. In addition, nitridated layers 53, 54 provide a reduced gate leakage and a lower standby current ($1_{OFF}$) in the final device than is realized with conventional oxide layers. Etch time is minimized to the extent that little or no corner rounding of STI 41 occurs during the HF etch. Nitridation of substrate 40 has been avoided which provides good electron mobility in channel regions in the final device.

Optionally, the process represented in FIGS. 5a–5c can also be applied to forming three different gate oxide thicknesses. The structure shown in FIG. 3c in the first embodiment could also be accomplished by partially etching back first growth oxide layer 32a rather than completely etching it back and growing a second oxide layer to provide layers 35. The partial etch back is preferred in that it causes little or no corner rounding to STI features and thereby prevents an excessive electric field.

In a fourth embodiment, the present invention is a method of forming three different gate oxide thicknesses on a substrate which is useful in fabricating semiconductor devices that have several functions or systems on a chip (SOC) wherein different types of circuits requiring different gate oxide thicknesses are needed. In this case, the device has an embedded DRAM (e-DRAM) functionality on a logic chip. One of the active regions which has a thicker gate oxide layer will be used to make a DRAM (I/O) circuit while two other active regions with thinner gate oxide layers will be used to make low power and high performance circuits for the logic functionality in the final device. This embodiment has a special feature in employing $HfO_2$ as one of the gate oxides.

Since $HfO_2$ has a higher k dielectric constant than $SiO_2$, it provides higher device and circuit performance when used as a gate oxide.

Figure 6A:
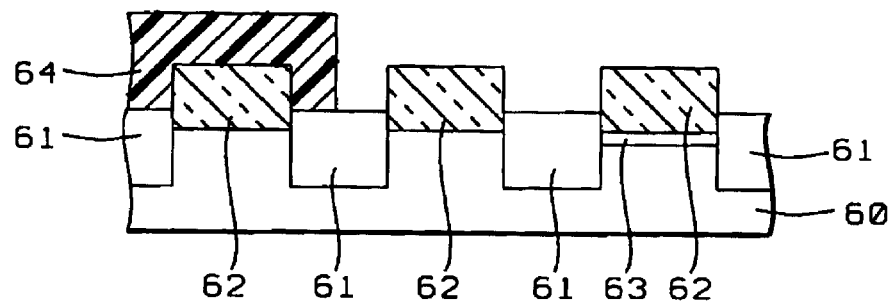
FIGS. 6a–6d are cross sectional views of a substrate that show a method of forming three different gate oxide thicknesses including one that has a high dielectric constant according to another embodiment of the present invention.

Referring to FIG. 6a, a substrate 60 is provided with STI regions 61 separating active areas. One of the active areas that will become a high performance logic circuit has a nitrogen implant region 63 near the top of substrate 60 that is selectively formed by a nitridation similar to the one described in the first embodiment. An oxide layer 62 is then grown on active areas. Oxide layer 62 is formed by depositing 3 Angstroms of $SiO_2$ with an RTO method followed by deposition of 25 Angstroms of $HfO_2$ and will be referred to hereafter as a $HfO_2$/silicate layer. The $HfO_2$ is typically deposited by an atomic layer CVD (ALCVD) or metal-organic CVD (MOCVD) process. A photoresist layer 64 is patterned on $HfO_2$/silicate layer 62 and on STI features 61 and selectively covers a portion of $HfO_2$/silicate layer 62 that will become part of a DRAM circuit and exposes portions of $HfO_2$/silicate layer 62 on active areas that will be fabricated into logic circuits.

Figure 6B:
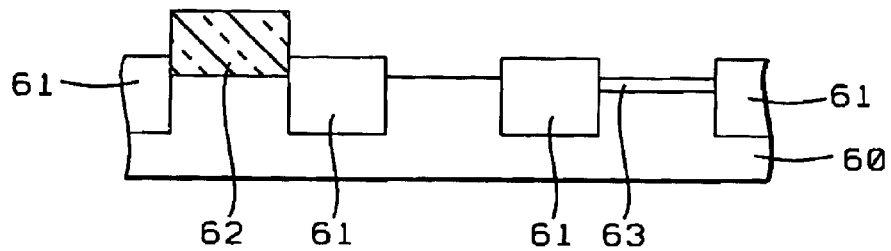

As shown in FIG. 6b, exposed portions of layer 62 are then removed by a dilute HF etch similar to the one described in the first embodiment. Photoresist 64 is removed with a liquid stripper and substrate 60 is cleaned with SC-1 and SC-2 solutions. In this case a dilute HF dip is inserted between the SC-1 and SC-2 steps since $HfO_2$ has a nearly zero wet etch rate in dilute HF. Active area 65 is a portion of substrate 60 between two STI features 61 and an adjacent active area is comprised of a nitridated region 63 at the top of substrate 60.

Figure 6C:
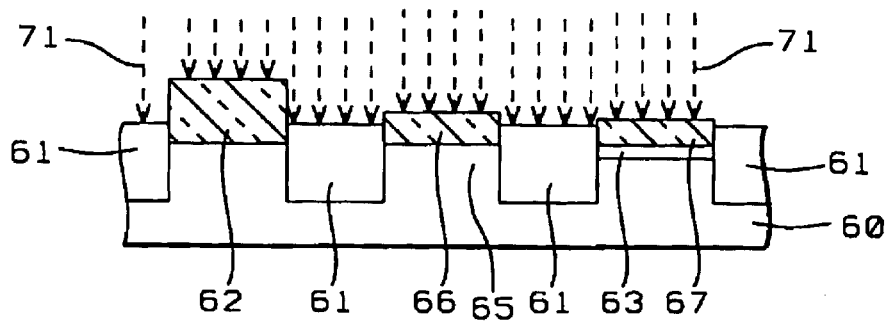

Referring to FIG. 6c, substrate 60 shown in FIG. 6b is placed in an RTO chamber at 650° C. for a period of 10 seconds to grow a 10 Angstrom thick layer 67 of $SiO_2$ over region 63 and a 15 Angstrom thick $SiO_2$ layer 66 on active area 65 where there is no nitridated region to retard oxide growth. The substrate 60 is then annealed in a low pressure rapid thermal processing (LPRTP) tool at a temperature of between 600° C. to 1050° C. with a $N_2$ flow rate of 5 slm (standard liters per minute) and a He flow rate of 5 slm for a period of 30 to 120 seconds while the chamber pressure is maintained at between about 10 and 100 Torr. This process densifies and removes moisture from the $HfO_2$/silicate layer 62.

Figure 6D:
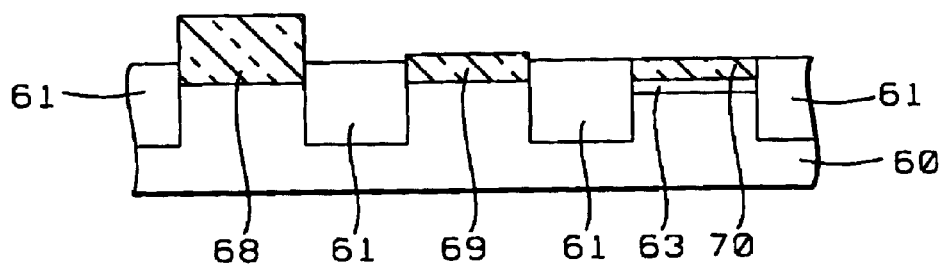

A nitridation 71 is then performed on the entire substrate 60 using conditions similar to those described in the first embodiment. As a result of the nitridation process on substrate 60, layers 62, 66, and 67 in FIG. 6c become nitridated oxide layers 68, 69, and 70, respectively, in FIG. 6d. Because of a higher dielectric constant associated with nitridated oxide layers 68, 69, and 70, their effective oxide thicknesses are reduced to 20 Angstroms for layer 68, 10 Angstroms for layer 69, and 8 Angstroms for layer 70. The annealing process on substrate 60 in the LPRTP tool is repeated at this point which improves the interface condition between substrate 60 and layer 68, between substrate 60 and layer 69 and between region 63 of substrate 60 and layer 70.

Substrate 60 is now ready for additional processing of forming gate electrodes on the nitridated gate oxide layers 68, 69, and 70, forming source/drain regions between STI features 61, and forming contacts to gate electrodes and to source/drain regions. Those skilled in the art are well aware of the types of processes that are useful in completing integrated circuits on layers 68, 69, and 70 on substrate 60 and a detailed description is not included here. An example can be found in U.S. Pat. No. 6,171,911.

The advantages of the fourth embodiment over prior art are several. First, a higher k dielectric material, $HfO_2$, is used to lower the EOT of a gate dielectric layer. A lower effective oxide thickness for $HfO_2$ means that at the same physical gate thickness required to prevent a gate breakdown in the circuit, $HfO_2$ has better electrical properties than $SiO_2$ to allow a higher performance circuit in a device. This feature is combined with a nitridation of all oxide layers to prevent boron migration between gate electrode and channel regions in the final device. Nitrogen content in the oxide layers also reduces leakage of current across the gate in the standby mode. Three different effective oxide thicknesses can be formed with this method to enable the fabrication of reliable, high performance devices with combined DRAM and logic functionality.

Figure 7A:
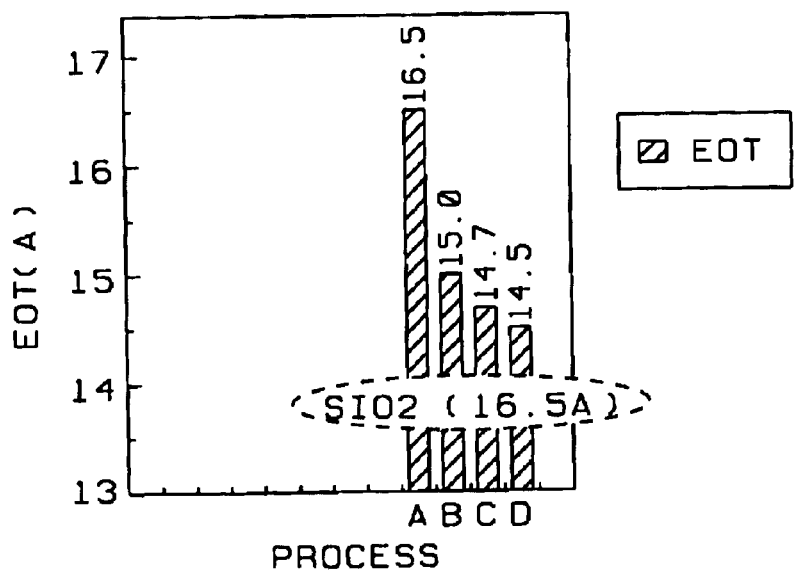
FIG. 7a is a plot showing the reduction in effective oxide thickness after a nitridation of a gate oxide layer.

With regard to all embodiments, the inventors have discovered that nitridation of gate oxide layers is a useful method of lowering the effective oxide thickness. This means that the physical thickness of a gate oxide can be maintained to prevent breakdown of the circuit while the nitrogen content increases the dielectric constant k to improve the electrical performance and thereby effectively reduce the apparent oxide thickness to provide higher speeds in the circuit Referring to FIG. 7a, a plot of effective oxide thickness (EOT) vs. process condition illustrates the beneficial result of introducing nitrogen into the gate oxide layer. Condition A on the x-axis represents a control sample with a standard 16.5 Angstrom thickness of $SiO_2$ and no nitridation. Condition B is treatment of a 16.5 Angstrom thickness of $SiO_2$ using a nitridation recipe comprising a $N_2$ flow rate of about 100 sccm, a power of 300 Watts, a pressure of 1.5 Torr at 100° C. for 30 seconds. Condition C is similar to condition B except that the time is lengthened to 60 seconds. Condition D is similar to condition B except the time is lengthened to 90 seconds. The EOT is reduced from 16.5 Angstroms for A to 15.0 Angstroms for B, 14.7 Angstroms for C, and 14.5 Angstroms for D.

Figure 7B:
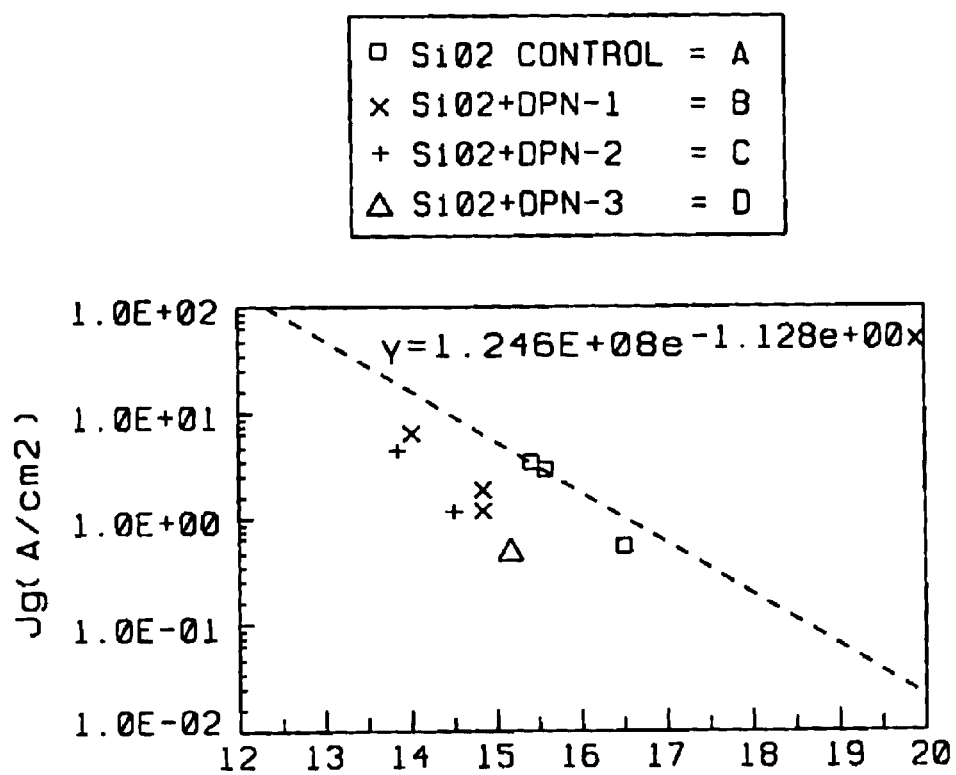
FIG. 7b is a plot that illustrates a reduction in gate leakage due to a plasma nitridation of gate oxide layers.

FIG. 7b shows the advantage of nitridation of oxide layers from a current leakage standpoint. EOT is plotted vs. leakage current in Jg $[A/cm^2]$. For a given EOT, the leakage current is less for nitridated gate oxides than for a control with standard $SiO_2$ only. For example, a point representing condition D (triangle symbol) at an EOT of 15.3 Angstroms is significantly lower on the vertical scale (leakage current) compared to a point representing control A (square symbol) at an EOT of 15.5 Angstroms.

While this invention has been particularly shown and described with reference to, the preferred embodiments thereof, it will be understood by those skilled in the art that various changes in form and details may be made without departing from the spirit and scope of this invention.

We claim:

1. A method of forming three gate oxide layers with three different oxide thicknesses on a substrate, comprising:

(a) providing a substrate with isolation regions and three active areas where circuits are to be formed, said active areas are separated by said isolation regions;

(b) growing a first oxide layer on said substrate in the three active areas, said first oxide layer has a first oxide thickness;

(c) removing the first oxide layer from two of the active areas;

(d) growing a second oxide layer on said substrate wherein said second oxide layer has a second oxide thickness on the two active areas without said first oxide layer and wherein said second oxide layer increases the first oxide thickness on the first oxide layer and the first oxide thickness is greater than the second oxide thickness; and (e) nitridating the second oxide layer with a second oxide thickness in one active area to form a third oxide layer with a third oxide thickness which is less than the second oxide thickness.

2. The method of claim 1 wherein the isolation regions are shallow trench isolation features in a silicon substrate.

3. The method of claim 1 wherein growing the first oxide layer is performed in an oxidation furnace with a dry oxygen ambient at a temperature of between 600° C. and 800° C. and the oxide layer is silicon dioxide grown to a thickness of between 50 and 60 Angstroms.

4. The method of claim 1 wherein removing the first oxide layer from two active areas is accomplished by patterning a photoresist layer on said substrate to cover the first oxide layer in one active area and then removing the exposed first oxide layer with a dilute HF etchant.

5. The method of claim 1 further comprised of an annealing step between steps (c) and (d), said annealing is accomplished in a chamber and involves $N_2$ flowing at a rate of between 5 and 10 standard liters per minute (slm) and He flowing at a rate between about 5 and 10 slm while the surface of said substrate is heated to a temperature between about 900° C. and 1200° C. with a total chamber pressure between about 10 and 100 Torr for a period of 30 to 120 seconds.

6. The method of claim 1 wherein growing the second oxide layer is performed in an oxidation furnace with a dry oxygen ambient at a temperature of between 600° C. and 800° C. and the second oxide layer is silicon dioxide grown to a thickness of between 20 and 30 Angstroms.

7. The method of claim 1 wherein the nitridation is performed by patterning a photoresist layer on said substrate to cover the first oxide layer and the second oxide layer in one active area and then nitridating the exposed second oxide layer in a chamber with a $N_2$ flow rate of 100 sccm, a pressure of 1.5 Torr, and a power of 300 Watts for a period of 30 to 300 seconds at a temperature less than 100° C.

8. The method of claim 1 wherein an annealing step is performed after step (e), said annealing is accomplished in a chamber containing $N_2$ flowing at a rate of between 5 and 10 slm and He flowing at a rate of between about 5 and 10 slm while the surface of said substrate is heated to a temperature between about 900° C. and 1200° C. with a chamber pressure of between about 10 and 100 Torr for 30 to 120 seconds.

9. The method of claim 1 wherein the first oxide layer is used to make a MOSFET which is part of an I/O device circuit and the second oxide layers are used to make MOSFETs which are part of low power and high performance device circuits.

10. A method of forming a first MOSFET with a first gate oxide layer having a first oxide thickness, a second MOSFET with a second gate oxide layer having a second oxide thickness, and a third MOSFET with a third gate oxide layer having a third oxide thickness on a substrate comprising:

(a) providing a substrate with isolation regions, a first active area, a second active area, and a third active area where circuits are to be formed, said active areas are separated by said isolation regions;

(b) growing a first oxide layer on said substrate in the first active area, second active area, and third active area, said first oxide layer has a first oxide thickness;

(c) removing the first oxide layer from the second active area and from the third active area;

(d) growing a second oxide layer on said substrate wherein said second oxide layer has a second oxide thickness on the second and third active areas and wherein said second oxide layer increases the first oxide thickness on the first active area and the first oxide thickness is greater than the second oxide thickness;

(e) nitridating the second oxide layer in the third active area to form a third oxide layer, said third oxide layer has a third oxide thickness which is less than the second oxide thickness of the second oxide layer in the second active area;

(f) forming a gate electrode over the first oxide layer in the first active area, a gate electrode on the second oxide layer in the second active area, and a gate electrode on the third oxide layer in the third active area, (g) forming source/drain elements in said first active area, second active area, and third active area; and (h) forming contacts to said source/drain elements and to the gate electrodes, thereby forming first, second, and third MOSFETs.

* * * * *